United States Patent [19]
Itoh et al.

[11] Patent Number: 5,373,275
[45] Date of Patent: Dec. 13, 1994

[54] SUPERCONDUCTING MAGNETIC SHIELD AND PROCESS FOR PREPARING THE SAME

[75] Inventors: Ikuo Itoh; Shoichi Matsuda, both of Kawasaki; Shigeru Minamino; Tsunehiro Shimizu, both of Hikari; Tsutomu Sasaki, Kawasaki, all of Japan

[73] Assignee: Nippon Steel Corporation, Tokyo, Japan

[21] Appl. No.: 809,040

[22] Filed: Dec. 16, 1991

Related U.S. Application Data

[63] Continuation-in-part of Ser. No. 601,263, Oct. 19, 1990, abandoned.

[30] Foreign Application Priority Data

Oct. 23, 1989 [JP] Japan .................... 1-275539
Mar. 23, 1990 [JP] Japan .................... 2-71863

[51] Int. Cl.$^5$ .............. H01F 7/22; H01L 39/12; H01L 39/00; H01G 1/06
[52] U.S. Cl. .............. 335/216; 174/125.1; 174/35 MS
[58] Field of Search ........... 335/216, 301, 304; 29/599; 174/125.1, 35 MS; 505/739, 741, 822, 872, 1; 428/930

[56] References Cited

U.S. PATENT DOCUMENTS

| | | | |
|---|---|---|---|
| 3,262,024 | 7/1966 | Swartz | 174/125.1 |
| 3,361,940 | 1/1968 | Culver et al. | 505/872 X |
| 3,384,847 | 5/1968 | Vant-Hull | 505/872 X |
| 3,436,258 | 4/1969 | Neugebauer et al. | 174/125.1 |
| 3,611,078 | 10/1971 | Massar | 174/125.1 |
| 3,625,662 | 12/1971 | Roberts et al. | 335/216 X |
| 4,409,579 | 10/1983 | Clem | 335/216 |
| 4,803,452 | 2/1989 | Saji et al. | 428/901 X |
| 4,828,931 | 5/1989 | Ogawa et al. | 428/596 |
| 4,920,011 | 4/1990 | Ogawa et al. | 335/301 X |
| 4,942,379 | 7/1990 | Ogawa et al. | 335/301 |

FOREIGN PATENT DOCUMENTS

| | | |
|---|---|---|
| 0365171 | 4/1990 | European Pat. Off. |
| 2613115 | 9/1988 | France |
| 2627005 | 8/1989 | France |
| 61-183979(A) | 2/1985 | Japan |
| 2-94498(A) | 9/1988 | Japan |
| 2215847 | 9/1989 | United Kingdom |

OTHER PUBLICATIONS

Soviet Physics Technical Physics, vol. 23, No. 8, Sep. 1978, pp. 1100–1103, "Shielding Of Weak Magnetic Fields . . . ".
Vasil'ev et al. European Search Report, European Appln. No. 90120193.
"Magnetic Sheilding–Cylindrical Shielding–by Superconductive NbTi Thin Film" Collected Resume of Meeting of Cryogenics · Superconductor Society, 40th Meeting (Showa 63, Atumn), p. 208.
"Magnetic Shield Effects of Superconducting NbTi Films," Vacuum, vol. 30, No. 5 (1987). pp. 254–256.
"Magnetic Shielding by Superconducting Nb-40-Zr-10Ti Hollow Cylinder" Low Temperature Engineering, vol. 3, No. 4 (1968), pp. 163–170.
"Model for Flux Trapping and Shielding by Tubular Superconducting Sumples in Transverse Fields" IEEE Transaction on Magnetics, vol. MAG-15, No. 5, Sep. 1979, pp. 1349–1353.

Primary Examiner—Leo P. Picard
Assistant Examiner—Ramon M. Barrera
Attorney, Agent, or Firm—Kenyon & Kenyon

[57] ABSTRACT

The present invention is characterized by a superconducting magnetic shield comprising a seamless, bottomless hollow body or a seamless hollow body having a bottom, the hollow body having a wall comprised of, in the thickness direction thereof, at least one laminate structure comprising a unit of two layers of an Nb—Ti-base alloy layer and a metal layer having a high conductivity or three layers of the above two layers and a barrier layer sandwiched therebetween; a process for preparing a magnetic shield which comprises subjecting the magnetic shielding material to a heat treatment after deep drawing; and a process for preparing the magnetic shielding material.

11 Claims, 7 Drawing Sheets

SUPERCONDUCTING MAGNETIC SHIELD AND PROCESS FOR PREPARING THE SAME

This is a continuation-in-part of application Ser. No. 601263, filed Oct. 19, 1990, now abandoned.

BACKGROUND OF THE INVENTION

1. Field of the Invention

The present invention relates to a Nb—Ti-base alloy superconducting magnetic shield. More particularly, the present invention relates to a seamless magnetic shield in a hollow body form comprising a multilayer composite laminate composed of an Nb—Ti-base alloy layer and a metal layer having a high conductivity.

2. Description of the Related Art

In theory, a superconductor in the form of a hollow vessel having a bottom, or a hollow body not having a bottom, can provide a good shielding of the inside thereof from a magnetic filed until the strength of an external magnetic field reaches a certain value. This is because a superconducting shielding current flows in the superconductor in a close loop and generates a magnetic flux which cancels the total amount of flux close loof coused by an external field, and thus a magnetic field in the opposite direction is formed and the inside of the vessel becomes a low filed region. Accordingly, various magnetic shields having the above-described shape have been proposed, and some are in practical use. The prior art will now be described.

Figures 2A, 2B:
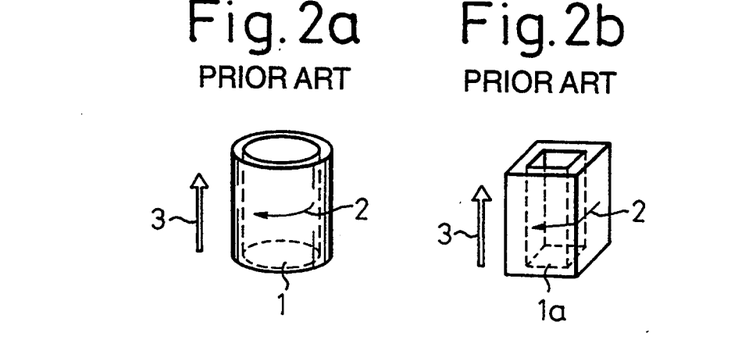
FIG. 2(a) shows a bottomless cylinder prepared by cutting an Nb block.
FIG. 2(b) shows a bottomless tetragonal cylinder prepared by cutting an Nb block.

(1) An Nb block is cut to form a cylinder 1 not having a bottom, as shown in FIG. 2(a), or a tetragonal hollow body 1a as shown in FIG. 2(b), and these bodies are used for a magnetic shielding of a sensor section of a AQUID magnete meter used for the measurement of a small magnetic field. For example, in this case, a superconducting shielding current 2 flows in a closed loop in a direction perpendicular to the direction of an external magnetic field 3, to thereby form a magnetic field, and thus reduce the external magnetic field.

Figure 3A:
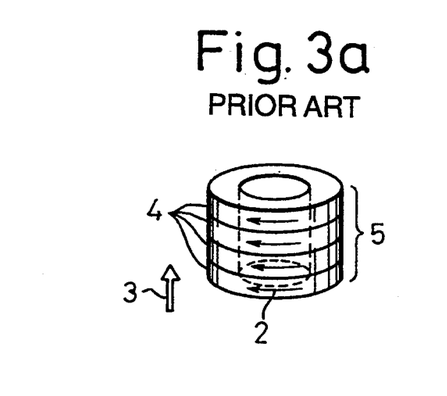
FIG. 3(a) shows a cylinder prepared by laminating doughnut-like superconducting disks of the same size and having a hole in the center thereof, one on top of the other.
Figure 3B:
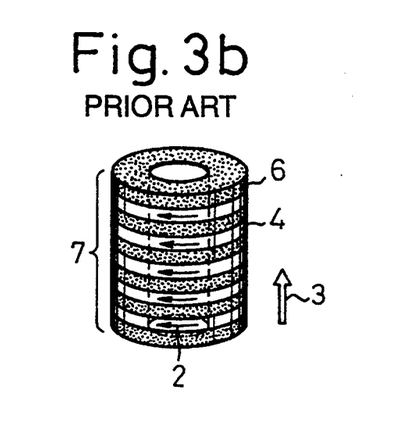
FIG. 3(b) shows a cylinder prepared by alternately laminating the superconducting disk shown in FIG. 3(a) and a normal conducting disk of copper or the like having the same outer diameter and hole diameter as those of the superconducting disk.

(2) As shown in FIG. 3, a superconductor in a sheet or foil form is formed into a doughnut-like disk 4 having a hole in the center thereof, and disks having the same shape are laminated one on top of the other to form a cylinder 5. Alternatively, the lamination is conducted while sandwiching a normal conductor 6 having the same shape as the disk, to form a cylinder 7. In this case, since a superconducting shielding current 2 flows only through superconducting disks, the cylinder 7 can shield only external fields parallel to axis.

Figure 4A:
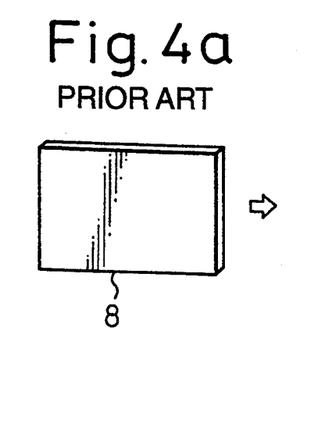
FIG. 4(a) shows a superconductor in the form of a tetragonal sheet or foil.
Figure 4B:
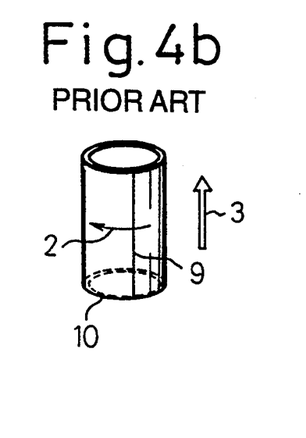
FIG. 4(b) shows a cylinder prepared by bending the sheet or foil shown in FIG. 4(a) and bonding the ends to each other.

(3) As shown in FIG. 4, a superconductor 8 in a square plate or foil form is cylindrically bent, and the meeting edges are connected to each other. In this case, a superconducting shielding current 2 forms a closed loop through a seam 9. This connection is usually conducted by welding, soldering, and contact bonding.

The method shown in FIG. 2, wherein a block material of a Nb or Nb—Ti is cut into a hollow body, has a poor yield, and further, to improve the magnetic shielding property, pinning centers which prevent a movement of quantized fluxes, i.e., maintain a zero resistivity, for example, a fine precipitate of a normal conductor, or a dislocation network must be distributed in the material. Especially for Nb—Ti, this requires that a cold working be conducted with a high percentage working before and after a heat treatment, under suitable conditions, but it is difficult to subject a block material to cold working with a high percentage working, and the cold working with a high percentage becomes more difficult after the block material is cut into a hollow body. A high percentage working, makes it difficult to prepare a hollow body capable of shielding a large space, from a block material.

To stabilize the superconducting property, it is necessary to dispose a metal having a high conductivity, such as Cu or Al, in a metallically bonded state around the superconducting material, such as Nb or Nb—Ti. Further, preferably the thickness of the superconducting layer is greatly reduced to about 100 $\mu$m or less, to stabilize the superconducting property. In the block material, however, a sufficient percentage working cannot be attained because of its large size, and thus a sufficient metallic bond cannot be obtained between the metal having a high conductivity and the superconducting material. Therefore, it is obvious that a formation of a multilayer with a superconducting layer having a thickness of about 100 $\mu$m or less is almost impossible.

The technique shown in FIG. 3 is effective when the size of the disk is relatively small. Although the technique has no shielding effect against transverse-fields, an excellent effect can be attained against longitudinal fields, since there is no seam to cause a lowering of the property in a loop through which a superconducting shielding current flows. In this case, it is relatively easy to form a multilayer with a metal having a high conductivity, and further, the thickness of the superconducting layer can be easily reduced to about 100 $\mu$m or less by deposition or sputtering. Nevertheless, since the material in the hole provided in the central portion is removed, the yield is poor when the proportion of the hole is high. Further, the size of the disk cannot be increased to more than the size of the plate used as the material. Moreover, a limitation exists in that it is relatively difficult to increase the size of the cylinder in the axial direction.

The technique shown in FIG. 4 provides an excellent yield of the material when preparing a cylinder, and further, facilitates an increase in the size of the cylinder in the axial direction. In this technique, however, a seam must appear, and this causes the superconducting property in the seam to become much lower than in the seamless portion. Bolting is unsatisfactory in the formation of a metallic bond, and welding causes a loss of pinning centers, such as precipitates and dislocations formed in the seamless portion; these bring a remarkable lowering of the property. With respect to soldering, there should exist a contact resistance which decreases the shielding effect.

Further, in the case of a multilayer sheet prepared by alternately laminating a metal having a high conductivity and a superconducting metal, it is almost impossible to conduct a satisfactory seaming.

SUMMARY OF THE INVENTION

The present invention is intended to solve the above-described problems.

Therefore, an object of the present invention is to provide a superconducting magnetic shield comprising a magnetic shield free of a seam causing a deterioration of a superconducting shield current.

Another object of the present invention is to provide a process for preparing a seamless superconducting shield.

A further object of the present invention is to provide a process for preparing a superconducting magnetic shielding material able to improve the superconducting magnetic shielding property.

A further object of the present invention is to provide a multilayer material comprising a heat-treatable or workable superconducting material and a metal having a high conductivity.

To attain the above-described objects, the present invention is characterized by the constitution of the following superconducting magnetic shield, the process for preparing the shield, and the material of the shield.

Specifically, the present invention is characterized in that the superconducting magnetic shield is in the form of a seamless hollow vessel having a bottom, or a seamless hollow body not having a bottom, comprising a sheet or foil composed of alternately laminated layers of at least one layer of an Nb—Ti-base alloy and at least one layer of a metal having a high conductivity.

Further, the present invention is characterized in that the metal layer having a high conductivity comprises at least one of copper, an copper alloy, aluminum, and an aluminum alloy, and that a barrier layer of Nb, Ta or a Nb—Ta alloy is provided between the Nb—Ti-base alloy layer and the metal layer having a high conductivity, to prevent interdiffusion and a formation of brittle intermetallic compounds.

Further, the present invention is characterized by a process for preparing a superconducting magnetic shield, which comprises press-molding a sheet or a foil composed of alternately laminated layers of at least one layer of a Nb—Ti-base alloy and at least one layer of a metal having a high conductivity, or a sheet or a foil having a diffusion-preventing barrier layer of Nb, Ta or Nb—Ta interposed between the Nb—Ti-base alloy layer and the metal layer having a high conductivity of the above-described sheet or foil, thereby preparing a seamless hollow vessel having a bottom, and optionally cutting the bottom to prepare a bottomless hollow body.

Further, the present invention is characterized by a process for preparing a superconducting magnetic shield, by which a pillar-like composite comprising alternately and concentrically laminated layers of at least one layer of a Nb—Ti-base alloy and at least one layer of a metal having a high conductivity, or a pillar-like composite having a diffusion-preventing barrier layer of Nb, Ta or Nb—Ta interposed between the Nb—Ti-base alloy layer and the metal layer having a high conductivity of the above-described pillar-like composite, is subjected to at least one of tube rolling, extruding and die drawing, to prepare a seamless hollow body not having a bottom.

Further, the present invention is characterized in that, subsequent to the above-described step, the product is subjected to a heat treatment at 300° to 400° C. for 2 to 3000 hr, and then to an optional cold rolling with a percentage working of 2 to 90%.

Further, the present invention is characterized by a process for preparing a superconducting magnetic shield material which comprises packing a hollow box or cylinder comprising at least one layer of a metal having a high conductivity with at least one layer of a barrier layer-coated Nb—Ti-base sheet, while alternately laminating the metal having a high conductivity to a percentage packing of 60% or more, closing the end portion of the hollow body, bringing the inside of the hollow body to a vacuum state for sealing by welding, to prepare an integral composite, subjecting the integral composite to hot working under conditions of a percentage working of 30 to 98% and a temperature of 500° to 1000° C., alternately repeating six times or less a heat treatment under conditions of a temperature of 300° to 450° C. and a retention time of 1 to 168 hr per time, and cold working with a percentage working of 30 to 98% per time, to prepare a sheet or a foil, and subjecting the sheet or foil to a final heat treatment under conditions of a temperature of 300° to 450° C. and a retention time of 2 to 3000 hr.

BRIEF DESCRIPTION OF THE DRAWINGS

All of the above-described superconductors are placed in an external magnetic field parallel to the axis of the hollow body, wherein a superconducting shielding current flows in a direction such that the magnetic field is negated, to thereby produce a magnetic shielding effect. It is also possible to spieled an external field perpendicular to the axis of the hollow body, except in the case of FIG. 3.

DESCRIPTION OF THE PREFERRED EMBODIMENT

A seamless superconducting magnetic shield in the form of a hollow vessel or a hollow body, as the subject matter of present invention, is prepared by subjecting a multilayer composite sheet comprising a layer of a superconducting alloy, e.g., a Nb—Ti-base alloy, and a metal layer having a high conductivity, e.g., a Cu layer, to pressing, tube rolling, extruding or die drawing.

Figure 6:
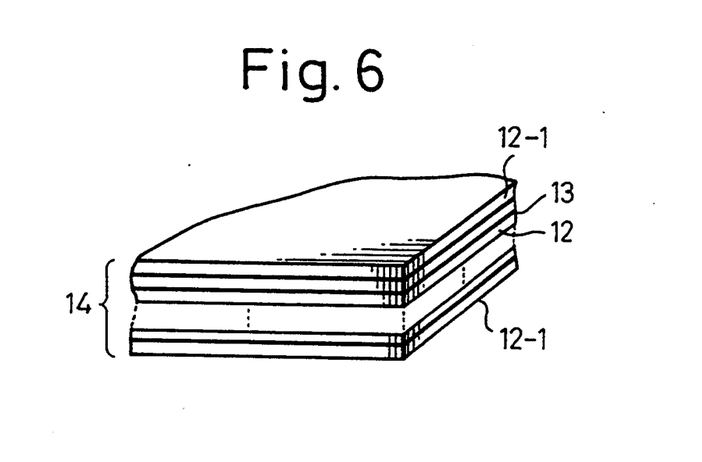
FIG. 6 is a cross-sectional perspective view of a Cu/Nb—Ti multilayer composite sheet comprising ten layers of Nb—Ti.

As shown in FIG. 6, the above-described multilayer composite sheet in a sheet or foil form according to the present invention is prepared by alternately laminating a Cu layer 12 and a Nb—Ti layer 13, disposing a relatively thick Cu layer 12-1 on the upper and lower surfaces, and subjecting the laminate to clad rolling.

The above-described multilayer composite magnetic shielding material exhibits a remarkably improved shielding property compared to the shielding material having the same structure and thickness, but in a single layer.

Such an improvement is attained for the following reason. Specifically, a high magnetic shielding property means high pinning force, and the smaller the thickness per layer, the larger the number of effective pins introduced. Therefore, when the percentage cold working is larger, as in the present invention, it is considered that the precipitation driving force of a precipitate serving as a pin is increased. Further, even when heat is locally generated due to flux jump, the multilayer exhibits an excellent stability due to its high cooling efficiency and high conductivity.

The above-described magnetic shield is prepared by subjecting the above-described multilayer composite sheet to pressing, tube rolling, extruding, die drawing or the like. Since the above-described multilayer composite sheet has an excellent workability, the Nb—Ti-base alloy layer and the metal layer having a high conductivity can be formed into a complete layer structure in the circumferential direction of the hollow body. Accordingly, it becomes possible to prepare a structure free of a remarkably heterogeneous portion over the whole circumference and having an excellent superconducting property, and this enables the problem of the prior art, i.e., the deterioration of the superconducting property due to a heterogeneity of the seam, and consequently, the lowering of the magnetic shielding property, to be solved. There is no limitation of the sectional form of the hollow body, and the sectional form may be circular, polygonal, etc. depending upon the applications of the magnetic shield.

Figure 5:
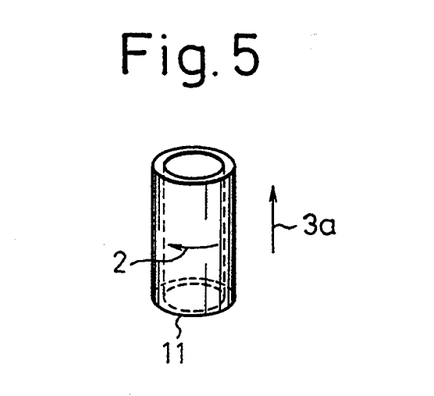
FIG. 5 shows a seamless cylindrical superconductor.

As shown in FIG. 5, in the case of a seamless superconductor in a hollow body form under longitudinal fields, a superconducting shielding current 2 flows in a closed loop in a direction perpendicular to the direction of an external magnetic field Bex (3a) parallel to the axial direction of the hollow body, to form a filed opposite to the exturnal field inside the cylinder. When a seam or a normal conducting portion exists in the course of the closed loop, the superconducting shielding current attenuates with time, and thus the superconducting magnetic shielding effect at the inner space of the cylinder is lost. According to the present invention, the superconducting shielding current can flow over the whole circumference of the hollow body without attenuation, and thus a high magnetic shielding effect can be semipermanently obtained, as long as the shield is super conductive.

The same is basically true in the case where one end of the above-described hollow body is closed with a sheet of the same material, i.e., a hollow vessel having a bottom. In the case of a hollow body having both open ends, a certain amount of a magnetic field generally enters the internal space from the open end in the case of a hollow vessel, having a bottom, the attenuation of external fields is greater than that of a hollow body with both ends open. Therefore, when the magnetic shielding is conducted by means of a hollow body having a relatively small length in the axial direction thereof, with higher efficiency, a hollow body having a bottom is suitable.

Further, to shield a stronger magnetic field, it is also possible to increase the thickness of the hollow vessel or a bottomless hollow body in such a manner that a plurality of hollow vessels or bottomless hollow bodies having similar shapes but slightly different sizes are provided, and these are placed concentrically one on top of the other.

In FIG. 5, the space in the inside of the hollow body is shielded against an external magnetic field from the outside of the hollow body. It is naturally possible for an object capable of generating the magnetic field, such as superconducting coil to be provided within the hollow body and the external space shielded against the magnetic field from the inside of the hollow body.

In the above-described embodiments, the superconductor is disposed in such a manner that the central axis of the hollow vessel or hollow body is parallel to the direction of the external magnetic field or internal magnetic field. It is also possible to conduct a magnetic shielding even when the central axis is perpendicular to the external or internal magnetic field or tilted at an angle of between 0° and 90° to the external or internal magnetic field.

The metal layer having a high conductivity plays an important role in the stabilizing of the superconducting property, and copper or aluminum having a small resistance is must preferable as the metal. These metals, however, have a considerably lower strength than that of the Nb—Ti-base alloy. To improve the workability of these metals in a composite form, it is also possible to add other elements in a small amount such that no significant lowering of the conductivity occurs. Further, the metal may be a copper alloy comprising Cu, and added thereto at least one of Ag, Zn, Sn, Ni, Si, P, Mn, Zr, Cr and Al, or an aluminum alloy comprising Al, and added thereto at least one of Ag, Zn, Sn, Ni, Si, P, Mn, Zr, Cr and Cu.

To obtain the above-described high superconducting magnetic shielding property, the pinning centers which pin the magnetic flux lines must be substantially homogeneously distributed within the Nb—Ti-base alloy layer at an appropriate density. Examples of the pinning centers in Nb—Ti alloy include dislocations and lattice defects, etc., introduced by cold working, and α-Ti precipitate produced by heat treatment. It has been confirmed that the α-Ti precipitate is very effective even in the case of a magnetic shielding by a sheet or a foil. This precipitate is an aging precipitate formed by heat treatment over a relatively long time. Therefore, in the case of a Cu/Nb—Ti multilayer composite sheet, different metals are diffused into each other at the interfaces thereof to form a hard, brittle Cu—Ti inter metallic compound. This causes the component ratio of the Nb—Ti-base alloy layer to change, and thus problems arise such as a deterioration of the superconducting property and the impossibility of subsequent working.

In this case, the provision of a barrier comprising a Nb, Ta or Nb—Ta alloy at the interface of Cu and Nb—Ti, to prevent diffusion, enables the above-described problems to be substantially completely solved. For example, a multilayer composite sheet can be prepared by laminating an Nb—Ti-base alloy sheet and a metal sheet having a high conductivity, each having a suitable thickness, while sandwiching an Nb foil between the alloy sheet and the metal sheet, hermetically sealing the laminate within a box made of a metal sheet having a high conductivity, and subjecting the assembly to rolling, etc.

Besides the Nb—Ti binary alloy, ternary or higher alloys comprising Nb—Ti, and added thereto at least one of Ta, Hf, V and Zr, also may be used as the Nb—Ti-base alloy.

A multilayer composite sheet comprising alternately laminated layers of a Nb—Ti-base alloy layer and a metal layer having a high conductivity is prepared, and the composite sheet is pressed to prepare a seamless hollow vessel or bottomless hollow body. Examples of the pressing include deep drawing, overhanging, forging and extruding. In the deep drawing, it is also possible to conduct shear deep drawing, re-deep drawing and a repetition thereof, to increase the length of the axial direction of the hollow vessel. Further, a stronger working may be conducted through the use of a combination with hydraulic forming or the adoption of spinning molding wherein use is made of a roll. The same is true where a barrier comprising Nb, Ta or a Nb—Ta alloy is disposed between the Nb—Ti-base alloy layer and the metal layer having a high conductivity. There is no limitation of the sectional form, which may be circular or polygonal.

Figure 9A:
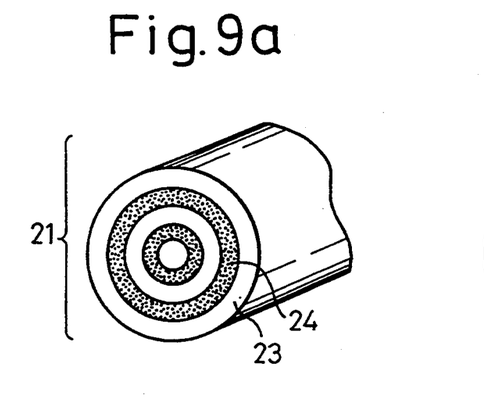
FIG. 9(a) is a cross-sectional perspective view of a Cu/Nb—Ti multilayer cylindrical composite before tube expanding.
Figure 9B:
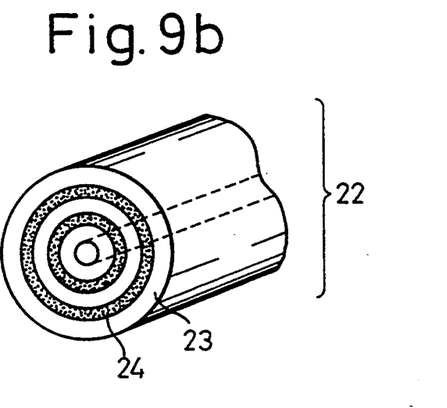
FIG. 9(b) is a cross-sectional perspective view of a multilayer cylindrical composite having a hole in the center thereof, before tube expanding.

In FIG. 9(a), a pillar-like composite comprising alternately and concentrically laminated layers of at least one N—Ti-base alloy layer and at least one metal layer having a high conductivity is prepared, and the composite is subjected to tube rolling, extruding, and die drawing, etc., to prepare a cylinder wherein individual layers are metallically bonded to each other. As shown in FIG. 9(b), a hole may be provided from the beginning at the center of the core member, i.e., working also may be started from a cylindrical composite. In this case, the outermost member and the core member may be either a Nb—Ti-base alloy or a metal having a high conductivity; although the metal having a high conductivity is preferable when the lubricity during working and the stability of the superconductor are taken into consideration. The Nb—Ti-base alloy layer and the metal layer having a high conductivity can be provided in such a manner that a concentrically complete layer structure is maintained in the circumferential direction of the cylinder. The same is true where a barrier comprising Nb, Ta or a Nb—Ta alloy is provided between the Nb—Ti-base alloy layer and the metal layer having a high conductivity. The section of the pillar-like composite or cylindrical composite may be in a polygonal form, such as tetragonal form, besides the above-described circular form. The same is true of the final sectional form after the tube expanding. These working methods are advantageous over the above-described pressing in that a longer and narrower product can be prepared. Examples of the tube rolling include mannesmann piercing and stiefel piercing, examples of the extruding include the Erhardt method, and examples of the die drawing include sinking, mandrel drawing and plug drawing.

The hollow vessel or bottomless hollow body is heat treated under conditions of a temperature of 300° to 450° C. and a retention time of 2 to 3000 hr. This causes the above-described α-Ti precipitate serving as a pinning center indispensable to an improvement of the magnetic shielding property. The heat treatment temperature is limited to 300° to 450° C., for the following reason. When the temperature is below 300° C., a longer retention time becomes necessary, and thus the production cost is high. On the other hand, when the temperature exceeds 450° C., the precipitate grows to a large size, which makes it impossible to improve the shielding property, regardless of the retention time. The retention time is limited to 2 to 3000 hr, for the following reason. When the retention time is shorter than 2 hr, the precipitate cannot be sufficiently formed. On the other hand, when the retention time exceeds 3000 hr, the precipitation is saturated, and thus no further effect can be attained and the production cost is high.

The above-described heat treatment may be conducted before molding into a hollow vessel or a bottomless hollow body. The precipitate in this case, however, lowers the workability, and it becomes impossible to conduct a heat treatment capable of remarkably improving the magnetic shielding property as intended in the present invention. Accordingly, the heat treatment is conducted after molding.

The reason why a slight cold working is conducted after the above-described heat treatment is that the dislocations introduced at that time interwine with the already formed precipitates to further improve the pinning force. The percentage working is limited to 2 to 90%. When the percentage working is less than 2%, no improvement in the property is attained, due to an insufficient working effect. On the other hand, when the percentage working exceeds 90%, the property is lowered due to an excessive breakage of the precipitate, and the material is broken during working.

The above-described multilayer composite sheet comprising alternately laminated layers of an Nb—Ti-base alloy layer and a metal layer having a high conductivity is preferably prepared by a clad rolling process disclosed in Japanese Unexamined Patent Publication No. 2-94498, previously filed by the present inventors, i.e., a process which comprises packing a hollow body in a box or cylindrical form comprising a metal having a high conductivity with at least one layer of an Nb or Ta foil-coated Nb—Ti-base alloy sheet in such a manner that the Nb—Ti-base alloy sheet and the above-described metal having a high conductivity are alternately laminated to a percentage packing of 60% or more, closing the end of the hollow body with the above-described metal having a high conductivity, bringing the inside of the hollow body to a vacuum state for sealing by welding, to prepare an integral composite, subjecting the integral composite to hot working under conditions of a percentage working of 30 to 98% and a temperature of 500° to 1000° C., alternately repeating six times or less a heat treatment under conditions of a temperature of 300° to 450° C. and a retention time of 1 to 168 hr per time and cold working with a percentage working of 30 to 98% per time to prepare a sheet or a foil to obtain a multilayer composite in a sheet or foil form.

In the preparation of the above-described multilayer composite, a final heat treatment under conditions of a temperature of 300° to 450° C. and a retention time of 2 to 3000 hr after the above-described cold working enables a further improved magnetic shielding property and workability to be imparted.

Figure 8:
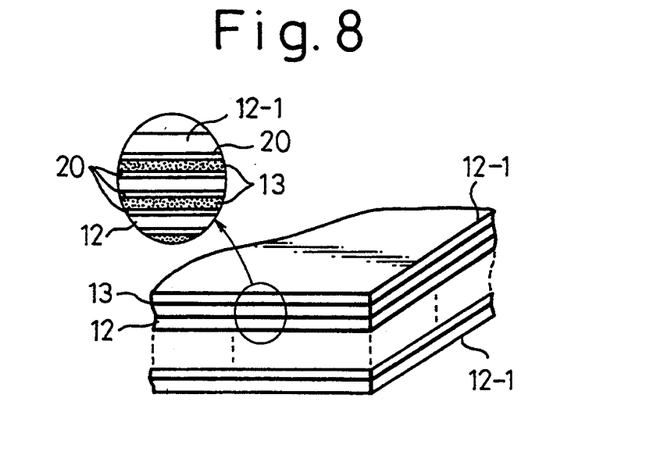
FIG. 8 is a cross-sectional perspective view of a multilayer composite sheet comprising a Cu/Nb—Ti multilayer composite sheet shown in FIG. 6 and a barrier layer of, e.g., Nb, interposed between the interface of Cu and Nb—Ti.

In the above-described hot working, cold working and final heat treatment, when a barrier layer, e.g., Nb or Ta layer 20, is provided at all of the interfaces of the Nb—Ti-base alloy layer 13 and the metal layer 12 having high conductivity, the subsequent working can be conducted more easily.

Specifically, when a heat treatment is conducted at a temperature capable of forming a Cu—Ti or Al—Ti compound for a considerably high temperature as in the case where the above-described heat treatment is conducted, the formation of this compound deteriorates the workability to a considerable extent. In this case, when the above-described barrier layer 20 is present between both the above-described layers, it becomes possible to substantially prevent the diffusion of the metal elements between both the layers during the heat treatment. Therefore, in the magnetic shielding material according to the present invention, high magnetic shielding property can be attained while maintaining a good workability. Due to this excellent workability, the thickness of the shielding material can be reduced to the order of several tens $\mu$m, so that not only can the weight of the shielding material be reduced but also the material cost per unit area of the shielding material can be lowered.

Figure 10A:
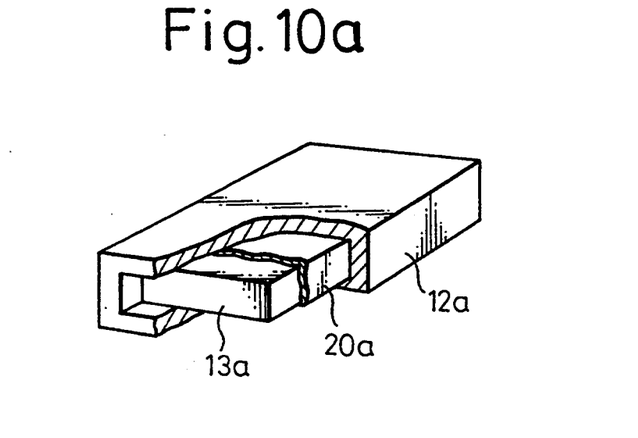
FIG. 10(a) is a diagram showing a hollow body of an oxygen-free copper in a box form having inserted therein one layer of Nb—Ti-base alloy coated several times with an Nb foil.
Figure 10B:
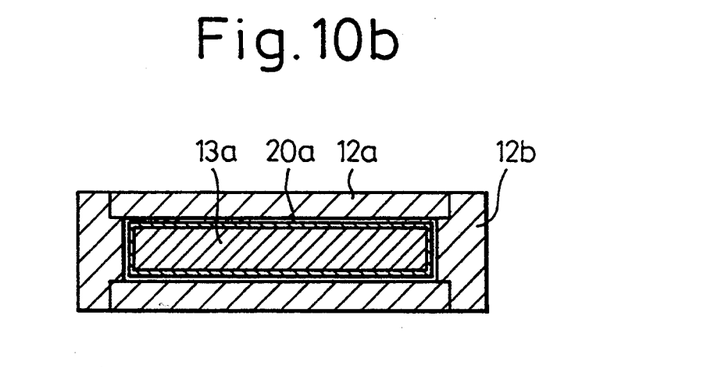
FIG. 10(b) is a longitudinal cross-sectional view of the composite shown in FIG. 10(a) provided with a lid of oxygen-free copper at both ends thereof.
Figure 10C:
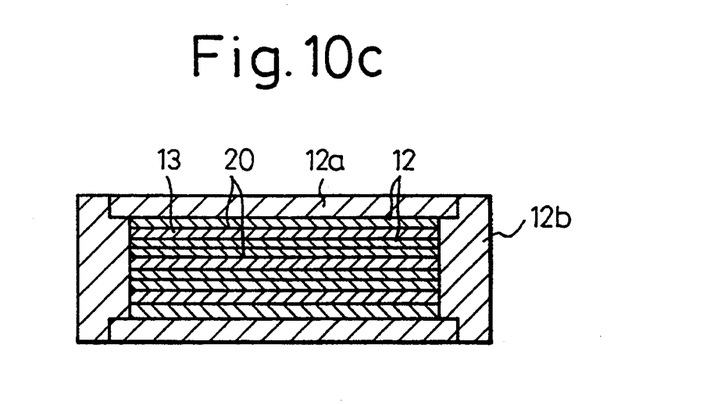
FIG. 10(c) is a longitudinal cross-sectional view of an composite prepared by fabricating the single layer composite material shown in FIG. 10(a) into thin materials, laminating a plurality of the materials, inserting the resultant laminate in a hollow body of an oxygen-free copper in a box form, and mounting an oxygen-free copper lid at both ends thereof.

An embodiment of a process for preparing the magnetic shielding material having the above-described barrier layer shown in FIG. 8 is shown in FIGS. 10(a) to (c). in FIG. 10(a), an Nb—Ti-base alloy sheet 13a coated with a foil 20a as a barrier over the whole surface is inserted in a relatively thick hollow body in a box form made of a metal having a high conductivity to a percentage packing of 60% or more, both ends of the above-described hollow body 12a are covered with a lid 12b, as shown in FIG. 10(b), the inside of the hollow body is brought to a vacuum state, hermetical sealing is conducted by electron beam welding or the like, and hot working, cold working, and heat treatment, etc. are then conducted. Thus, a good metallic adhesion is attained between individual members without internal oxidation, and a single layer composite having a good workability can be prepared. The reason why the percentage packing is limited to 60% or more is as follows. When the percentage packing is less than 60%, a distortion occurs in each member at an early stage of the working, which causes the material to be broken due to a deterioration of the adhesion.

As shown in FIG. 10(c), a plurality of the magnetic shielding materials in a thin sheet form thus prepared are laminated, hermetically sealed with the hollow body 12a and the lid 12b, and further subjected to working and heat treatment to prepare a multilayer magnetic shielding material as shown in FIG. 8 wherein the upper and lower surfaces are covered with a relatively thick metal layer 12-1 having high conductivity.

Figure 11A:
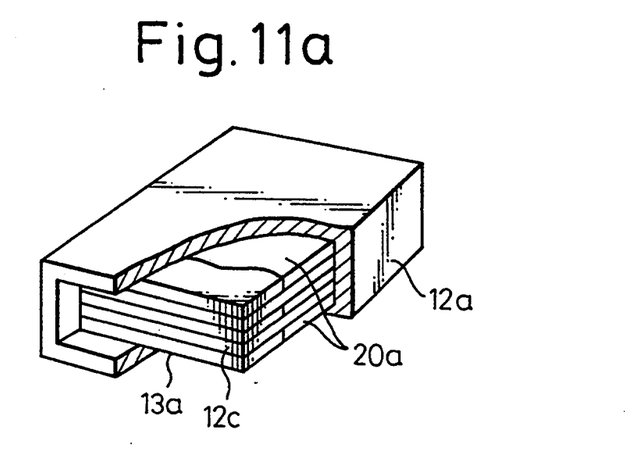
FIG. 11(a) is a diagram showing a hollow body of an oxygen-free copper having inserted therein a laminate of alternate layers of a Nb—Ti-base alloy sheet and an oxygen-free copper sheet.
Figure 11B:
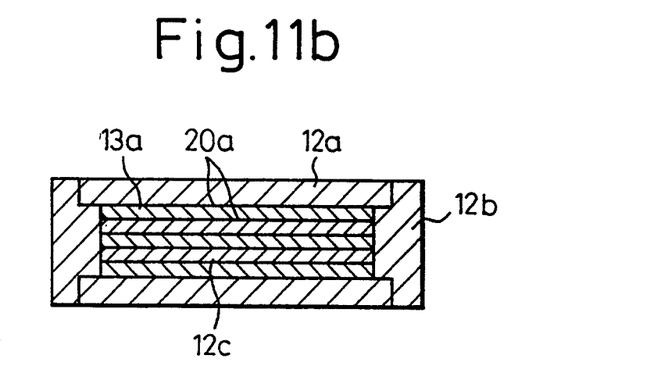
FIG. 11(b) is a longitudinal cross-sectional view of the integral composite shown in FIG. 11(a) provided with a lid of an oxygen-free copper at both ends thereof.

Another embodiment of the process for preparing the above-described magnetic shielding material is shown in FIGS. 11(a) and (b). In FIG. 11(a), a Nb—Ti-base alloy sheet 13a coated with a barrier layer 20a and a metal sheet 12c having a high conductivity are alternately laminated in the above-described hollow body 12a. The hollow body is then closed with a lid 12a as shown in FIG. 11(b), and the hermetical sealing, working, and heat treatment are conducted in the same manner as in the case shown in FIG. 10. The above-described process is advantageous in that the volume percentage of both metal sheets can be freely selected, a multilayer structure can be easily formed, and the number of layers can be freely increased.

Figure 12:
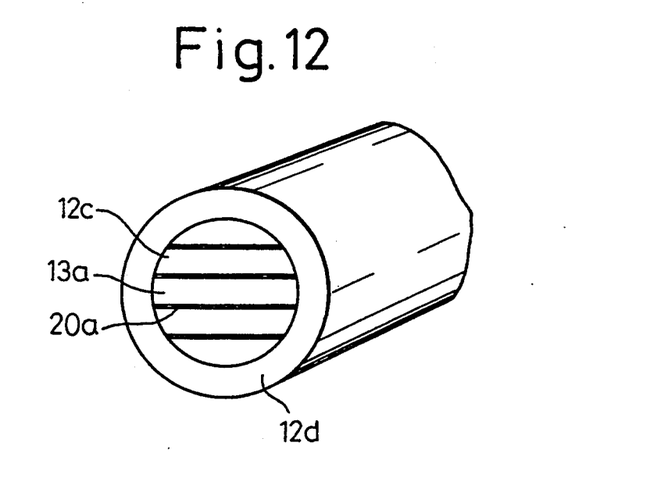
FIG. 12 is a diagram showing the lamination of an Nb—Ti-base alloy and a metal having a high conductivity in a hollow cylinder.

A multilayer magnetic shielding material shown in FIG. 8 can be prepared in the case of a cylindrical hollow body 12d shown in FIG. 12, besides a hollow body 12a in a box form shown in FIGS. 10 and 11.

The above-described steps are conducted to prepare the above-described magnetic shielding material. In this case, the reason why the above-described integral composite is subjected to hot working before the heat treatment and cold working is that, after the composite is heated to some extent to soften each member, they are subjected to contact bonding by rolling, forging, and extruding, etc., to attain a good metallic adhesion. The hot working temperature is limited to 500° to 1000° C. for the following reason. When the temperature is below 500° C., a sufficient adhesion is not attained because each member, particularly an Nb—Ti-base alloy having a high softening temperature, is still hard. On the other hand, when the temperature exceeds 1000° C. the temperature becomes close to the melting point of copper, among the metals having a high conductivity, which causes the nonconformity of the hardness between the metal having a high conductivity and the Nb—Ti-base alloy to become large, so that the adhesion lowers. When aluminum having a melting point as low as 660° C. is used, however, it is obvious that the hot working can be conducted at a temperature below the melting point. The percentage working in this case is limited to 30 to 98% for the following reason. When the percentage working is less than 30%, a sufficient adhesion is not attained even when the temperature is high. On the other hand, when the percentage working exceeds 98%, the percentage cold working necessary for an improvement in the magnetic shielding property cannot be attained.

The heat treatment temperature is limited to 300° to 450° C. When the temperature is below 300° C., the precipitation rate of the α-Ti fine particle serving as an important pinning center is so small that much time is needed for precipitation. On the other hand, when the temperature exceeds 450° C., the precipitated particle grows to a large size, so that the magnetic shielding property is unfavorably lowered. The retention time per time is limited to 1 to 168 hr. When the retention time is less than 1 hr, the absolute quantity of the precipitation is insufficient. On the other hand, when the retention time exceeds 168 hr, the precipitation is substantially saturated, so that a significant effect can be not attained even when the retention time is further increased.

Lattice defects, such as dislocations introduced by cold working and vacancies, become the driving force of the precipitation. A further improved effect can be attained when cold working is conducted to some extent before heat treatment. Alternate repetition of cold working and heat treatment brings a further improved effect. The number of repetitions is limited to 6 times or less. When the number of repetitions exceeds six, the cold working between individual heat treatments cannot be conducted with a sufficiently high percentage cold working, so that the maximum effect is reached.

Further, when the heat treatment and the cold rolling are alternately conducted in a plurality of number of times, the percentage cold working per time between individual heat treatments or up to a formation of a final shape is limited to 30 to 98%. When the percentage cold working is less than 30%, the amount of lattice defects introduced is insufficient, so that the effect of the heat treatment cannot be utilized. On the other hand, when the percentage working per time exceeds 98%, part or the whole of the material is broken, which brings a failure in working or an excessive increase in the thickness at the beginning of working, so that it becomes impossible to actually produce a superconducting shielding material.

The reason why the final heat treatment is conducted after cold working to a final sheet thickness is that the α-Ti particle precipitate effective as a pinning center in the magnetic field wherein the magnetic shielding is conducted is formed, and a synergistic effect can be attained by the formed α-Ti particle precipitate and the precipitate formed by the above-described heat treatment and subjected to working. The reason why the heat treatment temperature is limited to 300° to 450° C. is the same as in the case of the above-described heat treatment. The retention time is limited to 2 to 3000 hr. When the retention time is less than 2 hr, the absolute quantity of the precipitate is insufficient. On the other hand, when the retention time exceeds 3000 hr, the precipitation is substantially saturated, so that a significant effect cannot be attained even when the heat treatment is conducted for longer than 3000 hr.

When the sheet or foil subjected to the above-described final treatment is further subjected to cold working with a percentage working of 2 to 30% exclusive, an improvement in the magnetic shielding property is observed over the material subjected to the final heat treatment only. When the percentage working is less than 2%, a sufficient cold working effect is not attained. On the other hand, when the percentage working is 30% or more, the amount exceeds an optimal range and the magnetic shielding property is remarkably lowered.

Figure 13:
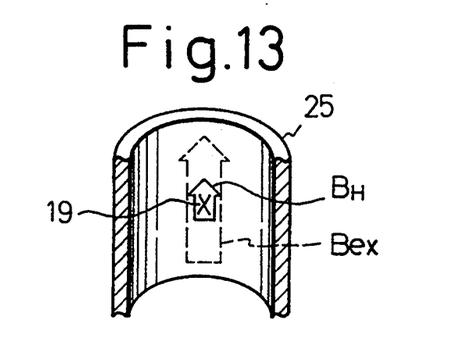
FIG. 13 is a diagram showing the measurement of magnetic shielding effect for a cylindrical volume immediately below the active area of a Hall element. A disk-like sample of a magnetic shielding material is placed in a vertical magnetic field.

The ΔB value was determined as shown in FIG. 13. Specifically, a magnetic shielding sample 25 was set in an external magnetic field $B_{ex}$ (a magnetic field in the absence of the sample) perpendicularly to the sample 25. The magnetic field $B_H$ with the sample 25 set in place was measured by a Hall probe, and the ΔB value was determined according to the following equation:

$$\Delta B = B_{ex} - B_H$$

Figure 14:
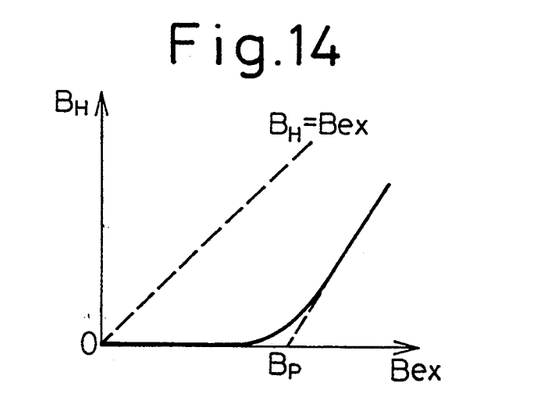
FIG. 14 is a graph showing the change in the magnetic shielding property $\Delta Bm$ with an increase in the external magnetic field; and, FIG. 15 is a graph showing the change in the shielding efficiency with an increase in the external magnetic field $B_{ex}$.

A general relationship between the above-described $B_{ex}$ and ΔB is shown in FIG. 14, so that the percentage increase of the ΔB value begins to decrease and the ΔB value reaches the maximum value ΔBm and then gradually decreases. Accordingly, the $S_{eff}$ value determined by the following equation was defined as a shielding efficiency:

$$S_{eff} = 100 \times \Delta B / B_{ex} \ (\%)$$

In the present specification, in particular, the $S_{eff}$ value when the $B_{ex}$ value was 0.5 Tesla was used as an index for evaluation of magnetic shielding property.

Figure 15:
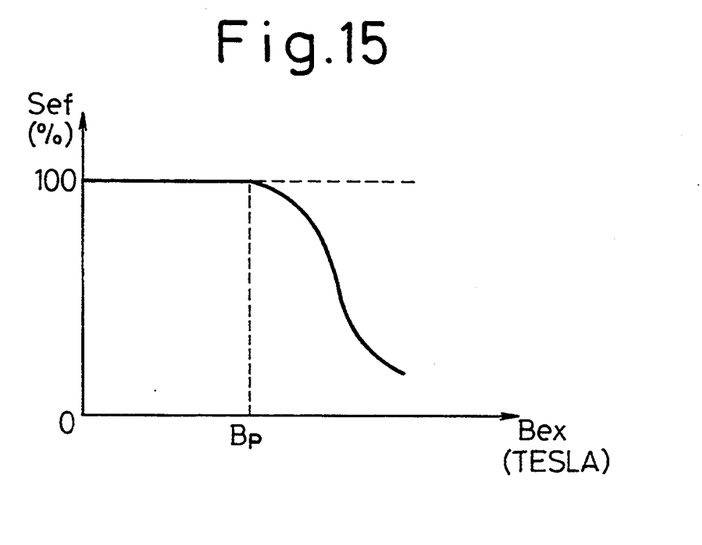

The relationship between the above-described shielding efficiently, $S_{eff}$, and the $B_{ex}$ value is shown in FIG. 15. The $S_{eff}$ value maintained about 100% until the $B_{ex}$ value reached a certain value but began to rapidly decrease as the $B_{ex}$ increased. It is also possible for the maximum $B_{ex}$ value $B_m$ until the $S_{eff}$ value can be maintained at about 100% to be used as an index for evaluation of the magnetic shielding property.

As described above, when the final heat treatment is conducted, the workability, particularly the deep drawing workability, improves, but when the deep ratio (depth/diameter) of the deep drawing is large, it becomes necessary to repeat the step of deep drawing a plurality of times. In this case, it is also possible to improve the workability through a further heat treatment between the steps of the deep drawing.

Thus, when the material is subjected to deep drawing and then a heat treatment at 300° to 450° C., the dislocations and defects introduced by distortion caused during working become a driving force for a new precipitation, which enables the magnetic shielding property to be further improved.

EXAMPLE

Example 1

Figures 1A, 1B:
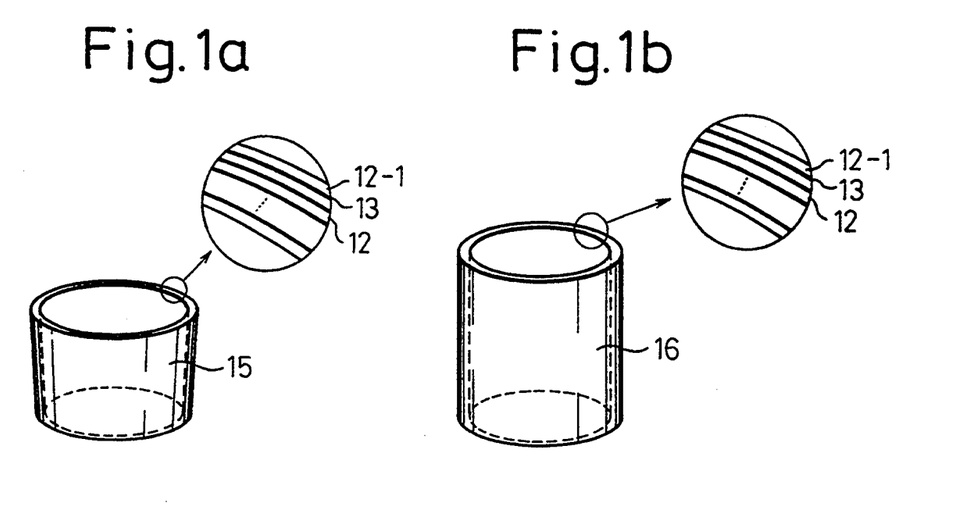
FIG. 1(a) shows a cylindrical vessel prepared by deep drawing of a sheet shown in FIG. 61.
FIG. 1(b) shows a cylinder prepared by removing the bottom of the cylindrical vessel.
Figure 1C:
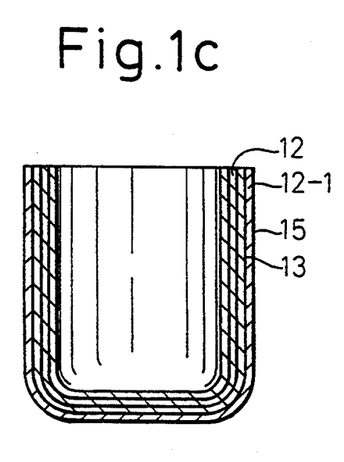
FIG. 1(c) is a longitudinal cross-sectional view of the cylindrical vessel shown in FIG. 1(a).
Figure 1D:
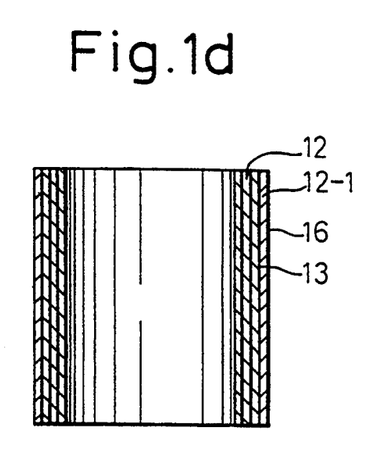
FIG. 1(d) is a longitudinal cross-sectional view of the cylindrical vessel shown in FIG. 1(b).

As shown in FIG. 6, a 0.77 mm-thick Cu/Nb—Ti multilayer composite sheet 14 comprising alternately laminated layers of nine Cu layers 12 each having a thickness of 30 μm and ten Nb—Ti 13 layers and a 100 μm-thick Cu layer 12-1 provided on both outermost surfaces was prepared by the clad rolling disclosed in the present invention. The multilayer composite 14 thus prepared was formed into a circular blank having a diameter of 70 mm, and deep drawing was conducted through the use of a punch having an outer diameter of 25 mm and a die having an inner diameter of 27.2 mm. Thus, a cylindrical vessel 15 as shown in FIG. 1(a) having an inner diameter of 25 mm, a wall thickness of 0.77 mm and a height of about 30 mm was prepared. The workability was excellent, and neither breakage or defects occurred in the course of the preparation of the cylindrical vessel.

Figure 7:
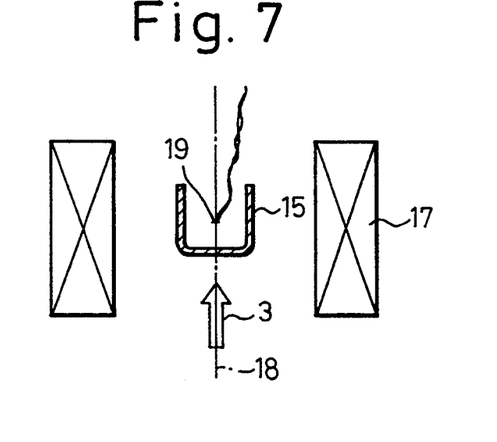
FIG. 7 is a diagram showing the measurement of magnetic shielding effect wherein a cylindrical vessel shown in FIG. 1(a) is set in a bore of a superconducting solenoid magnet, an external magnetic field is applied in parallel to the axis of the cylindrical vessel and a Hall probe is placed inside the vessel.

Then, as shown in FIG. 7, the above-described cylindrical vessel 15 was placed in the bore of a solenoid type superconducting coil 17, in such a manner that the central axis 18 of the cylindrical vessel and the magnetic field 3 produced by the coil were parallel to each other. Further, a Hall probe 19 having a diameter of 5 mm was set in the center portion of the vessel, and the whole was immersed in a liquid helium to examine the magnetic shielding property.

In this measurement, an excellent magnetic shielding property was obtained. Specifically, the shielding efficiency was almost 100% until the strength of the magnetic field produced by the coil reached 0.21 Tesla, and no attenuation of the property was observed for a measurable time.

The same level of results were obtained with respect to samples wherein use was made of alumina, various copper alloys, and aluminum alloy instead of copper.

For comparison, cylindrical samples indicated by numeral 1 of FIG. 2, numeral 7 of FIG. 3 and numeral 10 of FIG. 4 were subjected to the test in the same manner as that described above. The total thickness of the Nb—Ti layer of these samples and various sizes of the cylinder were made the same as those of sample 15 shown in FIG. 7, as much as possible. As a result, sample 1 shown in FIG. 2 exhibited a remarkable lowering in the magnetic shielding property in the magnetic field having a strength of about one-tenths of that in the case of the product of the present invention. Pressure welding and soldering, etc., were attempted on the sample 10 shown in FIG. 4, but because of the electrical resistance at a seam, the magnetic shielding effect was attenuated and disappeared for a very short time. With respect to sample 7 shown in FIG. 3, the magnetic shielding property was on the same level as that of the sample of the present invention, but since the area proportion of the central hole was very large and the material for that portion was removed, the yield of the material was very low.

Example 2

A cylindrical vessel 15 was prepared in the same manner as that of Example 1. The bottom portion of the vessel was cut to prepare a cylindrical sample 11 shown in FIG. 5, and the sample 11 was subjected to measurement of the magnetic shielding property. As a result, substantially the same level of high magnetic shielding property as that of the product of the present invention described in Example 1 was obtained, although a slight lowering in the magnetic shielding property was observed due to a greater penetration of the magnetic field from both ends. Similarly, no attenuation was detected.

Example 3

A Cu/Nb—Ti multilayer composite sheet as shown in FIG. 8 was prepared in the same manner as that of Example 1, except that a 1 μm-thick Nb barrier layer 20 was provided in all of the interfaces of the copper layer and the Nb—Ti layer, and the thickness of the whole sheet was 0.79 mm. Deep drawing was conducted in the same manner as that of Example 1. As a result, the workability was substantially the same as that of the sample of Example 1. The sample was subjected to measurement of the magnetic shielding property. As a result, a diffusion preventing effect by the barrier could be obtained particularly under heat treatment conditions of a long retention time used in Nos. 1 to 3 and No. 5 shown in Table 1, and the property was superior by 10 to 50% to the sample of Example 1 subjected to the same heat treatment. A cylinder after removal of the bottom exhibited a magnetic shielding property similar to that of Example 2. The same results were obtained when a Ta barrier or a Nb—Ta alloy barrier was used instead of the Nb barrier.

Example 4

As shown in FIG. 9(a), an Nb—Ti tube and a copper tube each having a wall thickness of 5.5 mm were alternately laminated in a copper tube having an outer diameter of 60 mm and an inner diameter of 48 mm, a copper rod having a diameter of 12 mm was inserted into the center of the tube, both ends thereof were closed with a copper lid, and the resultant composite was subjected to electron beam welding in vacuum and then subjected to tube expanding while making a hole in the center thereof by hot tube expanding or hot extruding, to thereby prepare a cylinder. Further, the cylinder was subjected to die drawing to prepare a cylinder having an outer diameter of 30 mm and a wall thickness of 2 mm, cut to a length of 30 mm to prepare a cylinder as shown in FIG. 1(b) and subjected to measurement of the magnetic shielding property in the same manner as that of Example 2. As a result, substantially the same level of magnetic shielding property was obtained.

The same level of magnetic shielding property was obtained in the case of a cylinder as shown in FIG. 9(b) having the same structure as that described above, except that the diameter of the center hole was 12 mm and the wall thickness of each tube was 4.5 mm. Further, the same level of magnetic shielding property was obtained in the case of a cylinder prepared by alternately and concentrically laminating tetragonal Nb—Ti tube and copper tube in a tetragonal copper tube and subjecting the resultant composite to the same working as that described above. Further, the same level of magnetic shielding property was obtained when an Nb foil was sandwiched between individual laminated tubes. Further, the same level of magnetic shielding property was obtained when a Ta foil or a Nb—Ta alloy foil was used instead of the Nb foil. Furthermore, the same level of magnetic shielding property was obtained when the final sectional form was tetragonal.

Example 5

A cylindrical sample 11 as shown in FIG. 5 was prepared in the same manner as that of Example 3, heat-treated under conditions shown in Table 1, and then subjected to the magnetic shielding property in the same manner as that of Example 1. In this case, the magnetic shielding property was evaluated based on the maximum value $B_m$ determined from the value, $B_{ex}$, of the external magnetic field and the value, $B_H$, of the magnetic field detected by a Hall probe. The results are shown in Table 1.

TABLE 1

| No. | Type | Heat treatment temp. (°C.) | Retention time (hr) | $B_m$ (Tesla) |
|---|---|---|---|---|
| 1 | present invention | 310 | 2500 | 0.58 |
| 2 | present invention | 350 | 1000 | 0.73 |
| 3 | present invention | 350 | 100 | 0.41 |
| 4 | present | 440 | 3 | 0.32 |

TABLE 1-continued

| No. | Type | Heat treatment temp. (°C.) | Retention time (hr) | $B_m$ (Tesla) |
| --- | --- | --- | --- | --- |
|  | invention |  |  |  |
| 5 | comparative | 290 | 3100 | 0.21 |
| 6 | comparative | 460 | 1 | 0.12 |

Example 6

A cylindrical sample was prepared in the same manner as that of Example 3, heat-treated under conditions shown in Table 2, subjected to cold tube expanding or die drawing with a percentage working shown in Table 2, and the magnetic shielding property evaluated in the same manner as that of Example 3. The percentage increase (%) of Bm value of a sample subjected to cold working relative to a sample as heat-treated was used as an index for the evaluation. The results are shown in Table 2.

TABLE 2

Percentage increase of $B_m$ (%) = 100 × (Bm after cold rolling/Bm after heat treatment − 1)

| No. | Type | Heat treatment temp. (°C.) | Retention time (hr) | Percentage cold working (%) | Percentage increase of Bm (%) |
| --- | --- | --- | --- | --- | --- |
| 1 | present invention | 350 | 1000 | 3 | 8 |
| 2 | present invention | 350 | 1000 | 40 | 38 |
| 3 | present invention | 350 | 1000 | 85 | 15 |
| 4 | comparative | 350 | 1000 | 1 | 0 |
| 5 | comparative | 350 | 1000 | 93 | −34 |

Example 7

As shown in FIG. 11(a), seven sheets 1 of a Nb-46 wt. % Ti alloy having a thickness of 5 mm, a width of 100 mm, and a length of 150 mm, and coated several times with an Nb foil 2 having a thickness of 0.1 mm and six sheets 4 of oxygen-free copper having the same size as that of the alloy sheet except that the thickness was 2 mm, were inserted into a hollow body 3 in a box form made of oxygen-free copper having an outer size of 58 mm in thickness, 112 mm in width, and 172 mm in length, and an inner size of 50 mm in thickness, 102 mm in width, and 172 mm in length. As shown in FIG. 2(b), both ends of the hollow body 3 were closed with a lid 5 having a size conforming to the hollow portion, and the parting lines were welded while conducting vacuum drawing for hermetical sealing, thereby preparing an integral composite. The integral composite was heated at a temperature of 750° C., hot-rolled to a thickness of 27 mm, subjected to cold rolling and heat treatment under conditions shown in Table 3 to prepare a disk sample having a thickness of 0.1 mm and a diameter of 50 mm, and subjected to measurement of the magnetic shielding property. In the measurement, the $S_{eff}$ value when the $B_{ex}$ value was 0.5 Tesla was determined as an index for evaluation of the magnetic shielding property.

The percentage intermediate working shown in Table 3 is a percentage working in the working conducted between a certain heat treatment and a subsequent heat treatment, and the percentage final working is a percentage working conducted immediately before the final heat treatment.

In Nos. 1 to 12, the shielding property was determined under constant conditions of the percentage intermediate working, final percentage working, and final heat treatment with varied intermediate heat treatment conditions and number of repetitions. Note, the intermediate working was not conducted on Nos. 1 and 10, wherein the number of repetitions was one. In Nos. 1 to 5, an improvement in the magnetic shielding property was observed by considerably prolonging the retention time (No. 1) when the heat treatment temperature was relatively low and by shortening the retention time and increasing the number of repetitions when the heat treatment temperature was high (Nos. 2 to 5). In particular, a high characteristic value was obtained under conditions of Nos. 2 and 3.

Nos. 6 to 12 are the same as Nos. 1 to 5, except that in each material, one of three conditions of the intermediate heat treatment temperature, retention time, and number of repetitions was changed. None of these cases satisfied the requirement of the present invention, and the magnetic shielding property was very poor. Among them, No. 11 became impossible to work in the course of final working, due to breaking of the material.

TABLE 3

| No. | Classification | Intermediate heat treatment temp. (°C.) | Retention time of intermediate heat treatment (hr) | Number of repetitions | Percentage intermediate working (%) | Percentage final working (%) | Final heat treatment temp. (°C.) | Retention time of final heat treatment (hr) | $S_{eff}$(%) at 0.5 T |
| --- | --- | --- | --- | --- | --- | --- | --- | --- | --- |
| 1 | Ex. | 310 | 160 | 1 | — | 70 | 360 | 200 | 40 |
| 2 | Ex. | 360 | 40 | 3 | 50 | 70 | 360 | 200 | 80 |
| 3 | Ex. | 360 | 20 | 5 | 50 | 70 | 360 | 200 | 80 |
| 4 | Ex. | 360 | 15 | 6 | 50 | 70 | 360 | 200 | 70 |
| 5 | Ex. | 440 | 2 | 6 | 50 | 70 | 360 | 200 | 50 |
| 6 | Comp. Ex. | 290 | 160 | 1 | 50 | 70 | 360 | 200 | 2 |
| 7 | Comp. Ex. | 460 | 2 | 6 | 50 | 70 | 360 | 200 | 8 |
| 8 | Comp. Ex. | 360 | 0.5 | 6 | 50 | 70 | 360 | 200 | 1 |
| 9 | Comp. Ex. | 440 | 0.5 | 6 | 50 | 70 | 360 | 200 | 1 |
| 10 | Comp. Ex. | 310 | 180 | 1 | — | 70 | 360 | 200 | 8 |
| 11 | Comp. Ex. | 360 | 15 | 7 | 50 | impossible to work | — | — | — |
| 12 | Comp. Ex. | 360 | 10 | 7 | 50 | 70 | 360 | 200 | 23 |
| 13 | Ex. | 360 | 40 | 3 | 35 | 70 | 360 | 200 | 58 |
| 14 | Ex. | 360 | 40 | 2 | 96 | 70 | 360 | 200 | 42 |
| 15 | Comp. Ex. | 360 | 40 | 2 | 99 | impossible to work | — | — | — |
| 16 | Ex. | 360 | 40 | 3 | 50 | 35 | 360 | 200 | 40 |
| 17 | Ex. | 360 | 40 | 3 | 50 | 96 | 360 | 200 | 70 |

TABLE 3-continued

| No. | Classification | Intermediate heat treatment temp. (°C.) | Retention time of intermediate heat treatment (hr) | Number of repetitions | Percentage intermediate working (%) | Percentage final working (%) | Final heat treatment temp. (°C.) | Retention time of final heat treatment (hr) | $S_{eff}(\%)$ at 0.5 T |
| --- | --- | --- | --- | --- | --- | --- | --- | --- | --- |
| 18 | Comp. Ex. | 360 | 40 | 3 | 50 | 25 | 360 | 200 | 6 |
| 19 | Comp. Ex. | 360 | 40 | 3 | 50 | 70 | 290 | 200 | 12 |
| 20 | Comp. Ex. | 360 | 40 | 3 | 50 | 70 | 460 | 200 | 5 |
| 21 | Comp. Ex. | 360 | 40 | 3 | 50 | 70 | 360 | 1 | 1 |
| 22 | Ex. | 360 | 40 | 3 | 50 | 70 | 360 | 1500 | 64 |
| 23 | Ex. | 360 | 40 | 3 | 50 | 70 | 360 | 2500 | 85 |
| 24 | Comp. Ex. | 360 | 40 | 3 | 50 | 70 | 360 | 3100 | 70 |

Nos. 13 and 14 were treated under the same conduction as that of No. 2, except that the number of repetitions of intermediate heat treatment and the percentage intermediate working were changed. In Nos. 13 and 14, the percentage intermediate working was close to the upper limit, and the magnetic shielding property thereof was not as good as that of No. 2.

No. 15 was the same as No. 14, except that only the percentage intermediate working was further increased to 99%. With No. 15, it became impossible to conduct working in the course of the final working, due to breaking of the material.

Nos. 16 and 17 were the same as No. 2, except for the percentage final working. The percentage working was close to the upper limit, and the property of No. 16 was not as good as that of No. 2. The property of No. 17 was considerably superior to that of No. 16 but slightly inferior to that of No. 2.

No. 18 was the same as No. 16, except that only the percentage intermediate working was further reduced to 25%. No. 18 brought about a remarkable lowering in the property.

Nos. 19 to 21 were the same as No. 2, except that one of two conditions of the final heat treatment temperature and the retention time was varied. None of these cases satisfied the requirement of the present invention, and the magnetic shielding property was very poor.

Nos. 22 and 23 were the same as No. 2, except that only the retention time of the final heat treatment was varied. In No. 22, a considerable improvement in the property was observed due to a prolonging of the retention time to 500 hr. In No. 23, the heat treatment time was close to the upper limit, and the property was lowered.

No. 24 was the same as No. 23, except that the retention time was further prolonged by 100 hr. This brought about a further remarkable lowering in the property.

As described above, according to the present invention, a seamless hollow vessel or a seamless, bottomless hollow body can be prepared which comprises a Cu/Nb—Ti multilayer composite sheet or a Cu/Nb or Ta barrier/Nb—Ti multilayer composite sheet. Therefore, it becomes possible to flow a large superconducting shielding current in the circumferential direction of the hollow body, which enables a stable high magnetic shielding property to be obtained as long as the hollow body is in a superconducting state.

Further, a suitable treatment or suitable treatment and cold working following molding of the material into a hollow vessel or a bottomless hollow body can remarkably improve the magnetic shielding property, compared to that of a product not subjected to this working, and thus the present invention is very useful from the viewpoint of industry.

We claim:

1. A superconducting magnetic shield comprising a seamless hollow body having a wall comprised of, in a thickness direction thereof, a more than three layer laminate structure comprising an Nb—Ti base alloy layer and a metal layer comprising at least one member selected from a group consisting of copper, copper alloy, aluminum and aluminum alloy which are laminated alternately.

2. A magnetic shield according to claim 1, wherein one opening of said hollow body is closed with a bottom comprising said more than three layer laminate structure.

3. A magnetic shield according to claim 1, wherein said laminate structure comprises a plurality of laminate structures and a barrier.

4. A magnetic shield according to claim 1, wherein the innermost layer member and the outermost layer member each comprise said metal layer.

5. A magnetic shield according to claim 2, wherein the innermost layer member and the outermost layer member each comprise said metal layer.

6. A magnetic shield according to claim 1, wherein the metal layer is copper alloy and the copper alloy has added thereto at least one member selected from the group consisting of Ag, Zn, Sn, Ni, Si, P, Mn, Zr, Cr and Al.

7. A magnetic shield according to claim 1, wherein the metal layer is aluminium alloy and the aluminium alloy has added thereto at least one member selected from the group consisting of Ag, Zn, Sn, Ni, Si, P, Mn, Zr, Cr, and Cu.

8. A magnetic shield according to claim 6, wherein the aluminum alloy comprises aluminum having added thereto at least one member selected from the group consisting of Ag, Zn, Sn, Ni, Si, P, Mn, Zr, Cr and Cu.

9. A magnetic shield according to claim 1, wherein more than one of said hollow bodies each having a different outer diameter and inner diameter are concentrically layered to form a hollow body having a wall of substantial thickness.

10. A magnetic shield according to claim 2, wherein more than one of said hollow bodies each having a different outer diameter and inner diameter are concentrically layered to form a hollow body having a wall of substantial thickness.

11. A magnetic shield according to claim 2, wherein a barrier layer is inserted between said Nb—Ti-base alloy layer and said metal layer.

* * * * *